United States Patent
Wei

(10) Patent No.: US 10,116,398 B2
(45) Date of Patent: Oct. 30, 2018

(54) SYSTEM FOR TESTING EFFICACY OF ELECTROMAGNETIC SHIELDING AND METHOD

(71) Applicant: HON HAI PRECISION INDUSTRY CO., LTD., New Taipei (TW)

(72) Inventor: Zih-Yui Wei, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 262 days.

(21) Appl. No.: 15/246,516

(22) Filed: Aug. 24, 2016

(65) Prior Publication Data

US 2018/0013501 A1    Jan. 11, 2018

(30) Foreign Application Priority Data

Jul. 7, 2016  (CN) .......................... 2016 1 0530289

(51) Int. Cl.
*H01Q 1/52*      (2006.01)
*H04B 17/00*     (2015.01)

(52) U.S. Cl.
CPC ......... *H04B 17/0087* (2013.01); *H01Q 1/526* (2013.01)

(58) Field of Classification Search
CPC ...................................... H01Q 1/526
USPC ......................................... 343/703
See application file for complete search history.

(56) References Cited

U.S. PATENT DOCUMENTS 8,878,733 B2 * 11/2014 He ..................... H01Q 3/08
                                                248/519

* cited by examiner

*Primary Examiner* — Andrea Lindgren Baltzell
(74) *Attorney, Agent, or Firm* — ScienBiziP, P.C.

(57) ABSTRACT

A system to test efficacy of electromagnetic shielding includes a radio frequency anechoic housing and a testing device. The testing device includes a signal source, at least one antenna, and a receiver. When one of the antenna is connected to the signal source, the receiver receives a first frequency field. When the antenna and the signal source are in the shielding shell and the shielding shell is in the radio frequency anechoic housing, the receiver receives a second frequency field. Values of the shielding efficacy are obtained according to the first frequency field and the second frequency field. A determination of whether the shielding shell meets requirements is obtained according to the values of the shielding efficacy. A method for testing shielding efficacy is also disclosed.

20 Claims, 5 Drawing Sheets

SYSTEM FOR TESTING EFFICACY OF ELECTROMAGNETIC SHIELDING AND METHOD

CROSS-REFERENCE TO RELATED APPLICATIONS

This application claims priority to Chinese Patent Application No. 201610530289.7, filed on Jul. 7, 2016, the contents of which are incorporated by reference herein.

FIELD

The subject matter herein generally relates to testing procedures, and especially relates to a system for testing efficacy of electromagnetic shield and method.

BACKGROUND

Testing for electromagnetic emissions and immunities is necessary for most electronic devices. Structures of workstations are complex. The workstation cannot always apply useful tests.

BRIEF DESCRIPTION OF THE DRAWINGS

Implementations of the present technology will now be described, by way of example only, with reference to the attached figures.

DETAILED DESCRIPTION

Figure 1:
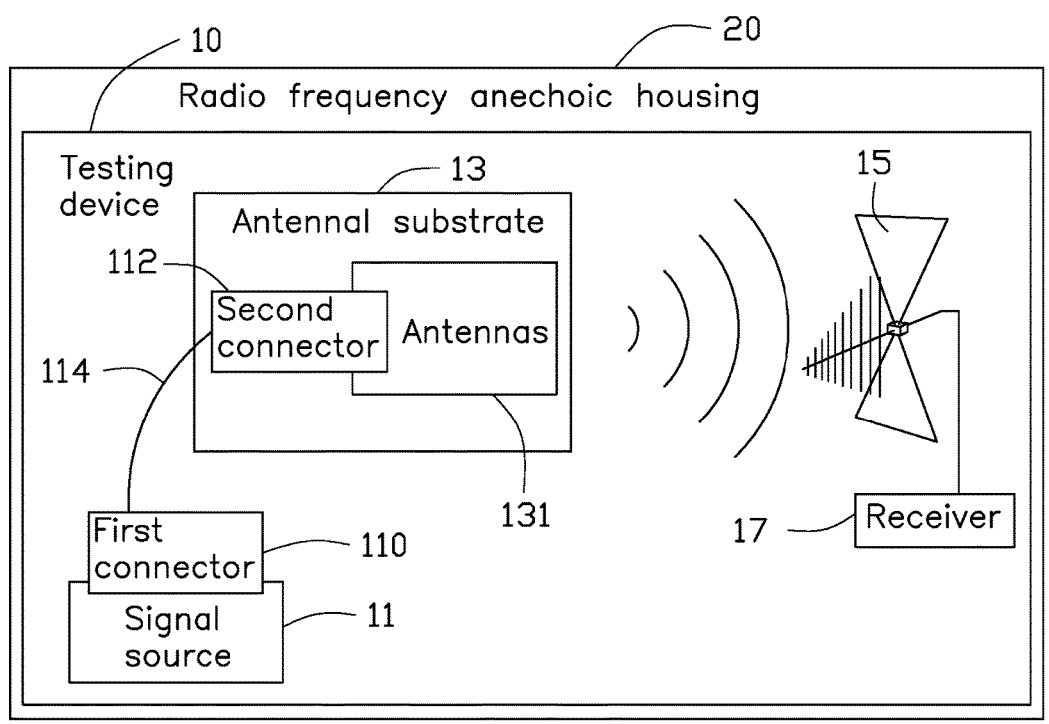
FIG. 1 is a block diagram of a system for testing efficacy of electromagnetic shielding.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

A definition that applies throughout this disclosure will now be presented.

The term "comprising" means "including, but not necessarily limited to"; it specifically indicates open-ended inclusion or membership in a so-described combination, group, series, and the like.

The instant disclosure provides a system for testing efficacy of electromagnetic shieldings 100. The system for testing efficacy of electromagnetic shield 100 includes a testing device 10 and a radio frequency anechoic housing 20. The testing device 10 is installed in the radio frequency anechoic housing 20.

The testing device 10 includes a signal source 11, an antenna substrate 13, a receiving antenna 15, and a receiver 17. The signal source 11 includes a first connector 110. The antenna substrate 13 includes a second connector 112. The signal source 11 connects to the antenna substrate 13 through the first connector 110 and the second connector 112. A cable 114 connects the first connector 110 and the second connector 112. The first connector 110 and the second connector 112 are SMA connectors. The receiver 17 is a frequency spectrum analyzer. A distance between the antenna substrate 13 and the receiving antenna 15 can be between three and ten meters.

The antenna substrate 13 includes a number of antennas (antennas 131). Values of performance of each antenna 131 are different. The readings which constitute performance include radio frequencies, transmission directions, and matching rate. When the signal source 11 connects to one antenna 131, the signal source 11 sends a frequency field. The receiver 17 receives a first frequency field through the receiving antenna 15. When the signal source 11 connects to different antennas 131, the receiver 17 receives different first frequency fields, E01、E02、E03 . . . E0$n$, corresponding to the different aspects of performance.

Figure 2:
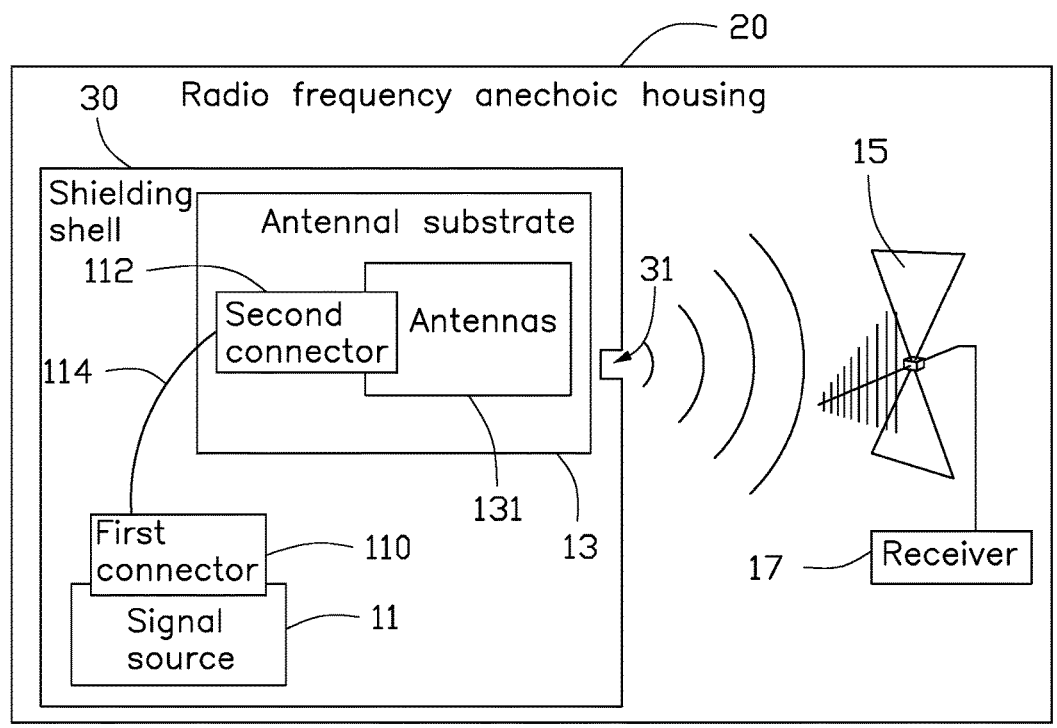
FIG. 2 is a block diagram of the system in FIG. 1 with a signal source and an antenna substrate in a shielding shell.

FIG. 2 illustrates the system for testing efficacy of electromagnetic shield 100 when testing a shielding of an electronic device. The signal source 11 and the antenna substrate 13 are installed in a shielding shell 30 of the electronic device. The testing device 10 and the shielding shell 30 are positioned in the radio frequency anechoic housing 20. When the signal source 11 connects to different antennas 131, the testing device 10 administers a test to obtain different second frequency fields, that is E11、E12、E13 . . . E1$n$. A shielding efficacy value SEn is $10*\log_{10}(E0n/E1n)$. The electronic device can be a computer. The shielding shell 30 can be an enclosure of the computer. The antenna substrate 13 can be installed on a motherboard of the electronic device.

The shielding shell 30 defines at least one through hole 31. The second frequency field is emitted through the through hole 31 of the shell 30 to be received by the receiver 15. A tester determines whether the shielding efficacy values of SE1-SEn meet requirements. When the shielding efficacy values of SE1-SEn meet all requirements, the shielding shell 30 passes test. When one of the shielding efficacy values of SE1-SEn which does not meet requirements, the shielding shell 30 itself is deemed to fail test. When the shielding shell 30 does not pass test, the tester can find defects of the shielding shell 30 and take measures to avoid or change the defect. For example, when the through hole 31 has defect, the tester can change a shape and a size of the through hole 31 until the shielding shell 30 passes test.

Figure 3:
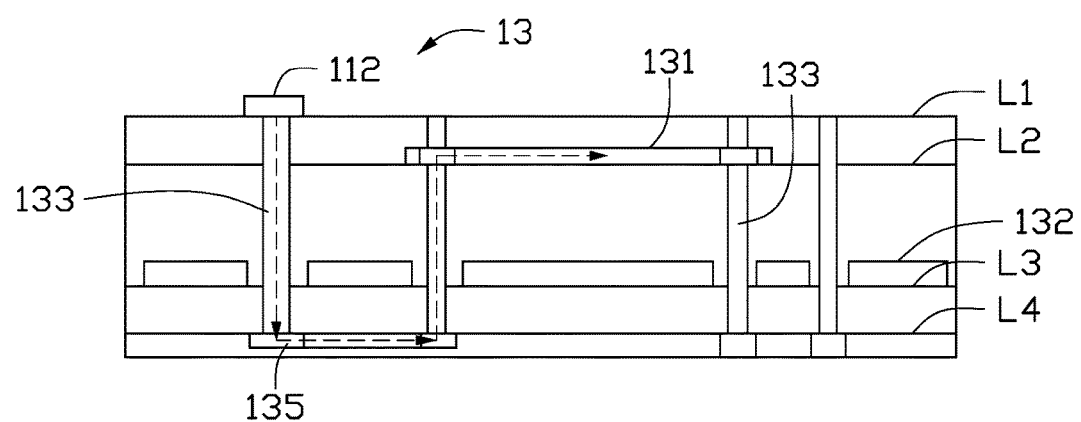
FIG. 3 is a side view of the antenna substrate in FIG. 2.

FIG. 3 illustrates that the antenna substrate 13 includes a first layer L1, a second layer L2, a third layer L3, and a fourth layer L4, in that order. The first layer L1 is a connecting layer. The second connector 112 is connected to the first layer L1. The second layer 12 is an antenna layer. The third layer 13 is a ground layer. The fourth layer L4 is a signal layer. The antenna substrate 13 defines a via hole 133 and a wire 135. The wire 135 is positioned in the via hole 133 and connects the second connector 112 to the antenna layer to transmit signal from the second connector 112.

Figure 4:
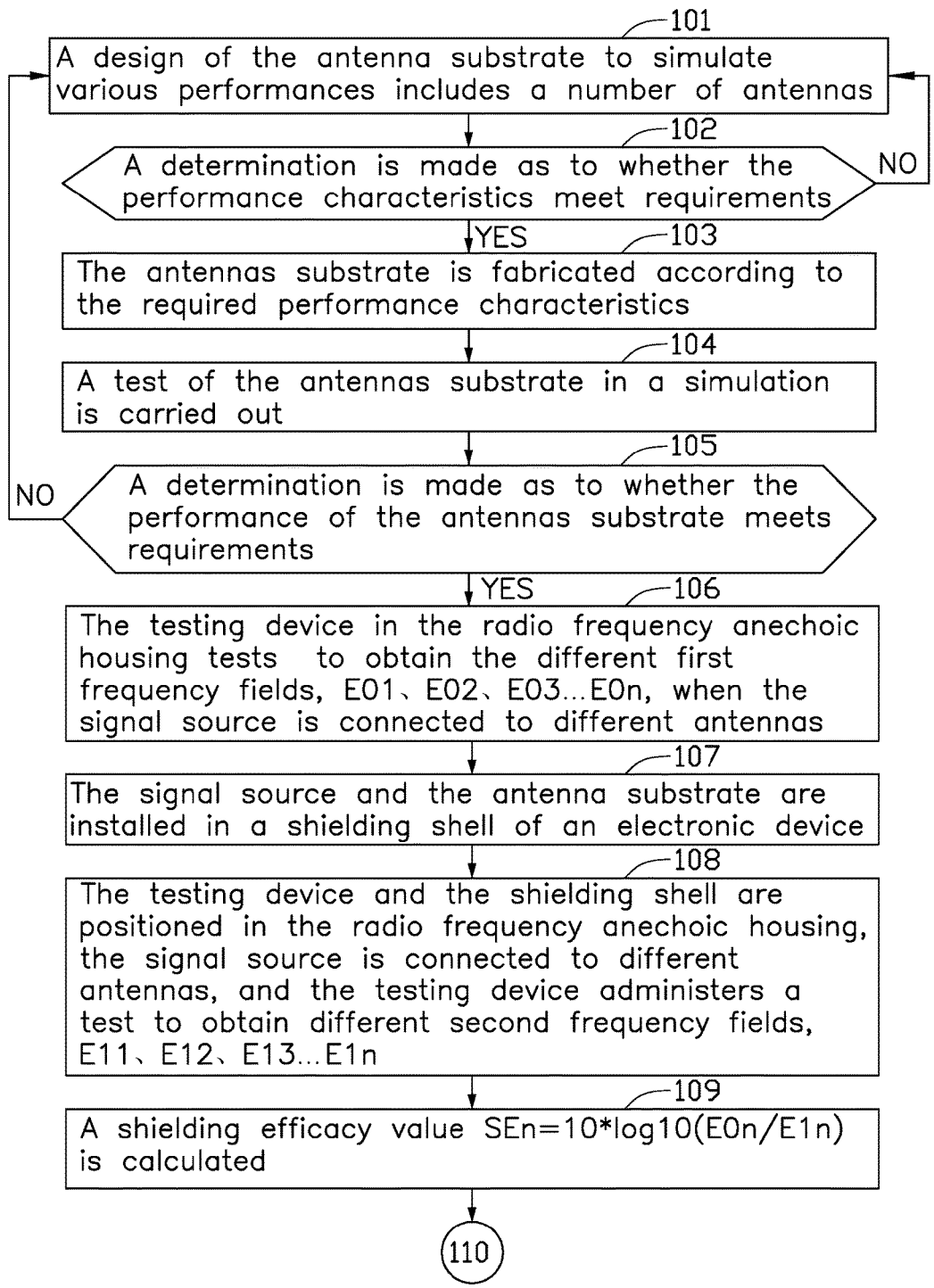
FIGS. 4-5 are a flowchart of a method for administering tests.
Figure 5:
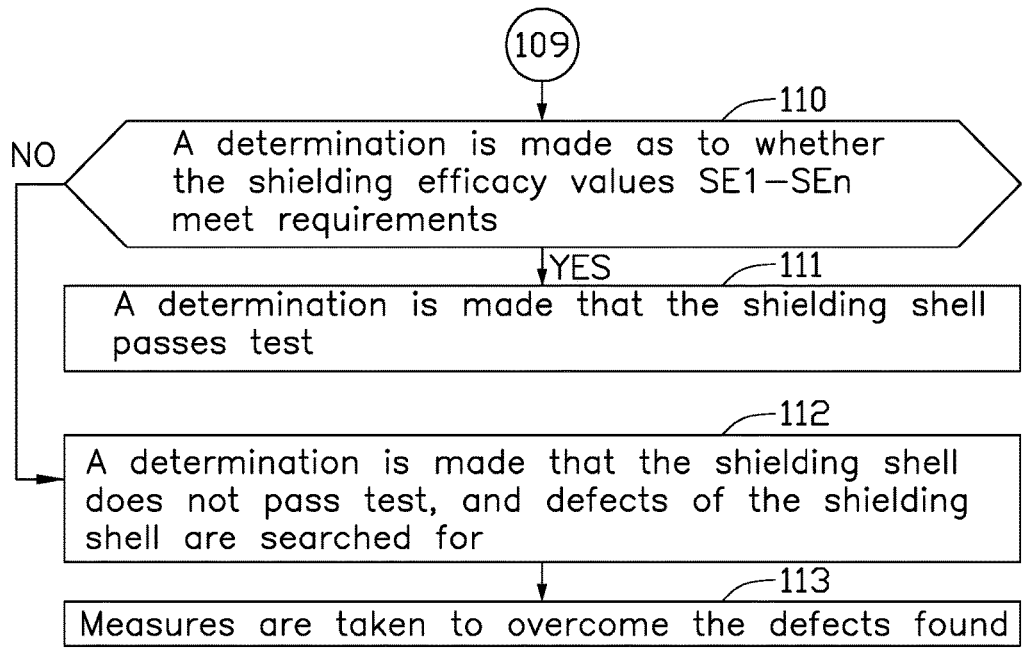

FIGS. 4-5 illustrate a testing shielding efficacy method according to an embodiment. The order of blocks in FIG. 4 illustrative only and the order of the blocks can change. Additional blocks can be added or fewer blocks may be utilized without departing from this disclosure. The exemplary method begins at block 102.

At block 101, a design of the antenna substrate 13 to simulate various performances includes a number of antennas 131. The antennas 131 have different performance characteristics. Each antenna 131 defines a via hole 133.

At block 102, a determination is made as to whether the performance characteristics meet requirements. If the performance characteristics meet requirements, the procedure goes to block 103, otherwise the procedure remains in block 101.

At block 103, the antennas substrate 13 is fabricated according to the required performance characteristics.

At block 104, a test of the antennas substrate 13 in a simulation is carried out.

At block 105, a determination is made as to whether the performance of the antennas substrate 13 meets requirements. If the antennas substrate 13 meets requirements, the procedure goes to block 106, otherwise the procedure goes to block 101.

At block 106, the testing device 10 in the radio frequency anechoic housing 20 tests to obtain the different first frequency fields, E01、E02、E03 . . . E0$n$, when the signal source 11 is connected to different antennas 131.

At block 107, the signal source 11 and the antenna substrate 13 are installed in a shielding shell 30 of an electronic device.

At block 108, the testing device 10 and the shielding shell 30 are positioned in the radio frequency anechoic housing 20. The signal source 11 is connected to different antennas 131, and the testing device 10 administers a test to obtain different second frequency fields, E11、E12、E13 . . . E1$n$.

At block 109, a shielding efficacy value SE$n$=10*log$_{10}$(E0$n$/E1$n$) is calculated.

At block 110, a determination is made as to whether the shielding efficacy values SE1-SE$n$ meet requirements. If the shielding efficacy values SE1-SE$n$ meet all requirements, the procedure goes to block 112, otherwise the procedure goes to block 111.

At block 111, a determination is made that the shielding shell 30 passes test.

At block 112, a determination is made that the shielding shell 30 does not pass test, and defects of the shielding shell 30 are searched for.

At block 113, measures are taken to overcome the defects found.

The embodiments shown and described above are only examples. Even though numerous characteristics and advantages of the present technology have been set forth in the foregoing description, together with details of the structure and function of the present disclosure, the disclosure is illustrative only, and changes may be made in the detail, comprising in matters of shape, size, and arrangement of the parts within the principles of the present disclosure, up to the full extent established by the broad general meaning of the terms used in the claims.

What is claimed is:

1. A system for testing efficacy of electromagnetic shielding comprising:
    a radio frequency anechoic housing;
    a testing device positioned in the radio frequency anechoic housing, the testing device comprising:
        an antennal substrate comprising at least one antenna;
        a signal source connecting to one of the at least one antenna to send a frequency field;
        a receiving antenna;
        a receiver for receiving a first frequency field through the receiving antenna; and
    a shielding shell;
        wherein when the antennal substrate and the signal source is positioned in the shielding shell and the shielding shell is positioned in the radio frequency anechoic housing, a receiver receives a second frequency field through the receiving antenna, a shielding efficacy value is obtained according to the first frequency field and the second shielding efficacy value, and a determination of whether the shielding shell meets requirement is obtained according to the shielding efficacy value.

2. The system for testing efficacy of electromagnetic shield as claimed in claim 1, wherein the antenna substrate defines a via hole for transmit the frequency field.

3. The system for testing efficacy of electromagnetic shield as claimed in claim 1, wherein the signal source comprises a first connector, the antenna substrate comprises a second connector, a cable connects between the first connector and the second connector, the signal source connects to the antenna substrate through the first connector and the second connector.

4. The system for testing efficacy of electromagnetic shield as claimed in claim 3, wherein the antenna substrate comprising a first layer, a second layer, a third layer and a fourth layer, in that order, the first layer is a connecting layer, the second layer is an antenna layer, the third layer is a ground layer, the fourth layer is a signal layer.

5. The system for testing efficacy of electromagnetic shield as claimed in claim 4, wherein the second connector is mounted on the first layer.

6. The system for testing efficacy of electromagnetic shield as claimed in claim 3, wherein the second connector is a SMA connector.

7. The system for testing efficacy of electromagnetic shield as claimed in claim 1, wherein a distance between the antenna substrate and the receiving antenna is about three meters.

8. A system for testing efficacy of electromagnetic shield comprising:
    a radio frequency anechoic housing;
    a testing device positioned in the radio frequency anechoic housing, the testing device comprising:
        an antennal substrate comprising at least one antenna;
        a signal source connecting to one of the at least one antenna to send a frequency field;
        a receiving antenna;
        a receiver for receiving a first frequency field E0$n$ through the receiving antenna; and
    a shielding shell;
        wherein when the antennal substrate and the signal source is positioned in the shielding shell and the shielding shell is positioned in the radio frequency anechoic housing, a receiver receives a second frequency field E1$n$ through the receiving antenna, a shielding efficacy value SE$n$ is obtained by SE$n$=10*log 10(E0$n$/E1$n$), and a determination of whether the shielding shell meets requirement is obtained according to the shielding efficacy value.

9. The system for testing efficacy of electromagnetic shield as claimed in claim 8, wherein the antenna substrate defines a via hole for transmit the frequency field.

10. The system for testing efficacy of electromagnetic shield as claimed in claim 8, wherein the signal source comprises a first connector, the antenna substrate comprises a second connector, a cable connects between the first connector and the second connector, the signal source connects to the antenna substrate through the first connector and the second connector.

11. The system for testing efficacy of electromagnetic shield as claimed in claim 10, wherein the antenna substrate comprising a first layer, a second layer, a third layer and a fourth layer, in that order, the first layer is a connecting layer, the second layer is an antenna layer, the third layer is a ground layer, the fourth layer is a signal layer.

12. The system for testing efficacy of electromagnetic shield as claimed in claim 11, wherein the second connector is mounted on the first layer.

13. The system for testing efficacy of electromagnetic shield as claimed in claim 10, wherein the second connector is a SMA connector.

14. The system for testing efficacy of electromagnetic shield as claimed in claim 8, wherein a distance between the antenna substrate and the receiving antenna is about three meters.

15. A testing shielding efficacy method comprising:
   designing an antenna substrate which comprising a plurality of antennas;
   connecting a signal source to one of antennas, the antennas installed on an antenna substrate;
   testing a first frequency field corresponding to the antenna connected to the signal source when the antenna substrate and the signal source are positioned in a radio frequency anechoic housing;
   testing a second frequency field corresponding to the antenna connected to the signal source when the antenna substrate and the signal source are positioned in a shielding shell and the shielding shell is positioned in the radio frequency anechoic housing;
   calculating a shielding efficacy value $SE_n = 10*\log 10(E0_n/E1_n)$; and
   determining whether the shielding efficacy value meet requirement.

16. The method as claimed in claim 15, further comprising:
   determining whether the shielding shell pass test according to the determination of whether the shielding efficacy value meet requirement.

17. The method as claimed in claim 15, wherein values of performance parameters of each antennas are different.

18. The method as claimed in claim 17, wherein the performance parameter comprise frequency.

19. The method as claimed in claim 17, wherein the performance parameter comprise direction.

20. The method as claimed in claim 17, wherein the performance parameter comprise matching rate.

* * * * *